United States Patent
Takamoto et al.

(10) Patent No.: US 9,768,050 B2
(45) Date of Patent: Sep. 19, 2017

(54) FILM FOR SEMICONDUCTOR BACK SURFACE AND ITS USE

(71) Applicant: NITTO DENKO CORPORATION, Ibaraki-shi, Osaka (JP)

(72) Inventors: Naohide Takamoto, Ibaraki (JP); Ryuichi Kimura, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

(21) Appl. No.: 15/168,847

(22) Filed: May 31, 2016

(65) Prior Publication Data

US 2016/0351432 A1    Dec. 1, 2016

(30) Foreign Application Priority Data

Jun. 1, 2015    (JP) .................. 2015-111442

(51) Int. Cl.
*H01L 21/683*    (2006.01)
*H01L 21/78*    (2006.01)
(Continued)

(52) U.S. Cl.
CPC .......... *H01L 21/6836* (2013.01); *H01L 21/78* (2013.01); *H01L 24/81* (2013.01); *H01L 24/83* (2013.01); *H01L 24/92* (2013.01); *H01L 21/561* (2013.01); *H01L 23/544* (2013.01); *H01L 23/562* (2013.01); *H01L 24/13* (2013.01); *H01L 24/16* (2013.01); *H01L 24/29* (2013.01); *H01L 24/32* (2013.01); *H01L 2221/68327* (2013.01); *H01L 2221/68336* (2013.01); *H01L 2221/68377* (2013.01); *H01L 2223/54433* (2013.01); *H01L 2223/54486* (2013.01); *H01L 2224/13111* (2013.01); *H01L 2224/13144* (2013.01); *H01L 2224/13147* (2013.01); *H01L 2224/16227* (2013.01); *H01L 2224/16245* (2013.01); *H01L 2224/2919* (2013.01); *H01L 2224/32225* (2013.01); *H01L 2224/32245* (2013.01);
(Continued)

(58) Field of Classification Search
CPC combination set(s) only.
See application file for complete search history.

(56) References Cited

U.S. PATENT DOCUMENTS

2009/0053518 A1    2/2009    Saiki et al.
2010/0099240 A1*   4/2010    Watanabe .............. C09J 7/0217
                                              438/464
(Continued)

FOREIGN PATENT DOCUMENTS

| JP | 2007-261035 A  |   | 10/2007 |
|----|----------------|---|---------|
| JP | 2008-6386 A    |   | 1/2008  |
| JP | 2008-166451 A  |   | 7/2008  |
| JP | 2016080993 A   | * | 5/2016  |

*Primary Examiner* — Mamadou Diallo
(74) *Attorney, Agent, or Firm* — Sughrue Mion, PLLC

(57) ABSTRACT

It is an object of the present invention to provide a film for semiconductor back surface having reworkability, and an application of the film. A film for semiconductor back surface has: an adhering strength at 70° C. of 7 N/10 mm or less to a wafer before the film is thermally cured; and a rupture elongation at 25° C. of 700% or less. The film for semiconductor back surface preferably has a degree of swelling due to ethanol of 1% by weight or more. The film for semiconductor back surface preferably contains an acrylic resin.

4 Claims, 2 Drawing Sheets

(51) Int. Cl.
*H01L 23/00* (2006.01)
*H01L 23/544* (2006.01)
*H01L 21/56* (2006.01)

(52) U.S. Cl.
CPC ............ *H01L 2224/73204* (2013.01); *H01L 2224/8191* (2013.01); *H01L 2224/81193* (2013.01); *H01L 2224/81815* (2013.01); *H01L 2224/83104* (2013.01); *H01L 2224/83862* (2013.01); *H01L 2224/92* (2013.01); *H01L 2224/92125* (2013.01); *H01L 2924/0103* (2013.01); *H01L 2924/0105* (2013.01); *H01L 2924/01029* (2013.01); *H01L 2924/01047* (2013.01); *H01L 2924/01079* (2013.01); *H01L 2924/01082* (2013.01); *H01L 2924/0665* (2013.01)

(56) References Cited

U.S. PATENT DOCUMENTS

| | | | |
|---|---|---|---|
| 2010/0314782 A1* | 12/2010 | Oonishi | C09J 7/02 257/778 |
| 2012/0018903 A1* | 1/2012 | Takamoto | C09J 163/00 257/778 |
| 2012/0028380 A1* | 2/2012 | Takamoto | B32B 7/12 438/15 |
| 2012/0028442 A1* | 2/2012 | Takamoto | C09J 5/06 438/460 |
| 2016/0064297 A1* | 3/2016 | Morita | H01L 21/561 438/126 |

* cited by examiner

FILM FOR SEMICONDUCTOR BACK SURFACE AND ITS USE

BACKGROUND OF THE INVENTION

Field of the Invention

The present invention relates to a film for a semiconductor back surface and its use.

Description of the Related Art

In recent years, thinning and downsizing of a semiconductor device and its packaging have been further required. Because of that, a flip-chip semiconductor device, in which a semiconductor element such as a semiconductor chip is mounted on a substrate by flip-chip bonding (flip-chip bonded), has been widely used as a semiconductor device and its packaging. In the flip-chip bonding, a circuit surface of a semiconductor chip is fixed to an electrode forming surface of the substrate in a way that the circuit surface is facing to the electrode forming surface. In such semiconductor device, etc., the back surface of the semiconductor chip may be protected by a protective film to prevent the semiconductor chip from damage, etc (for example, refer to Patent Documents 1 to 3).

PRIOR ART DOCUMENT

Patent Document

Patent Document 1: JP-A-2008-166451
Patent Document 2: JP-A-2008-006386
Patent Document 3: JP-A-2007-261035

SUMMARY OF THE INVENTION

At the production of the semiconductor device, a film for semiconductor back surface is typically used as follows. First, a film for semiconductor back surface is bonded onto the back surface of a semiconductor wafer (in many cases, a non-circuit-formed surface). Next, the semiconductor wafer is diced together with the film for semiconductor back surface to forma semiconductor element. Subsequently, the semiconductor element with the film for semiconductor back surface is picked up, and the semiconductor element is then flip chip-connected onto an adherend such as a substrate. The film for semiconductor back surface is thermally cured as necessary. Consequently, a flip chip type semiconductor device is obtained.

Herein, when the film for semiconductor back surface is bonded onto the semiconductor wafer, air bubbles may enter, or misalignment in bonding position may occur. The semiconductor device cannot be subjected to the next step in such a state, and this requires a procedure (rework) of peeling the film for semiconductor back surface from the semiconductor wafer and bonding a different (another) film for semiconductor back surface onto the semiconductor wafer.

Thus, reworkability which makes it possible to peel the film for semiconductor back surface from the semiconductor wafer and reuse the semiconductor wafer is required for the film for semiconductor back surface. However, the film for semiconductor back surface generally has a high adhering strength from the viewpoint of the continuous protection of the back surface of a semiconductor chip, and the reworkability of the film for semiconductor back surface has not yet been studied.

The present invention has been made in view of the foregoing problems, and it is an object of the present invention to provide a film for semiconductor back surface having reworkability, and an application of the film.

The present inventors earnestly studied for the purpose of solving the existing problems, and found that, by employing the following constitution, a film for semiconductor back surface having good reworkability can be provided. As a result, they completed the present invention.

That is, the present invention relates to a film for semiconductor back surface having: an adhering strength at 70° C. of 7 N/10 mm or less to a wafer before the film is thermally cured; and a rupture elongation at 25° C. of 700% or less.

Since the film for semiconductor back surface has a low adhering strength at 70° C. of 7 N/10 mm or less to a wafer before the film is thermally cured, the film for semiconductor back surface is easily peeled from a semiconductor wafer. Since the film for semiconductor back surface has a rupture elongation at 25° C. of 700% or less, unintentional stretching and rupture are prevented when the film for semiconductor back surface is peeled from the semiconductor wafer. Thus, since the film for semiconductor back surface has a low adhering strength, and is less likely to be stretched, the film for semiconductor back surface can exhibit good reworkability.

The film for semiconductor back surface preferably has a degree of swelling due to ethanol of 1% by weight or more. When the film for semiconductor back surface can be swollen to a degree in the above-mentioned range due to ethanol, the film for semiconductor back surface has a lower adhering strength to the semiconductor wafer, which can provide an improvement in easy peelability.

The film for semiconductor back surface preferably contains an acrylic resin. The film for semiconductor back surface preferably contains 50 to 200 parts by weight of an inorganic filler based on 100 parts by weight of the acrylic resin. Thereby, the adhering strength and the rupture elongation can be suitably controlled.

The present invention also relates to a dicing tape-integrated film for semiconductor back surface including: a dicing tape including a base material and a pressure-sensitive adhesive layer that are laminated in this order; and the film for semiconductor back surface laminated on the pressure-sensitive adhesive layer of the dicing tape.

The present invention also relates to a method for producing a semiconductor device using the dicing tape-integrated film for semiconductor back surface, the method including:

bonding a semiconductor wafer onto the film for semiconductor back surface of the dicing tape-integrated film for semiconductor back surface;

dicing the semiconductor wafer with a cutting depth so controlled as to fall within a range overstepping one surface of the pressure-sensitive adhesive layer that faces the film for semiconductor back surface and not reaching another surface of the pressure-sensitive adhesive layer that faces the base material to form a semiconductor chip;

peeling the semiconductor chip from the pressure-sensitive adhesive layer of the dicing tape together with the film for semiconductor back surface; and flip chip-connecting the semiconductor chip onto an adherend.

DETAILED DESCRIPTION OF THE PREFERRED EMBODIMENTS

Figure 1:
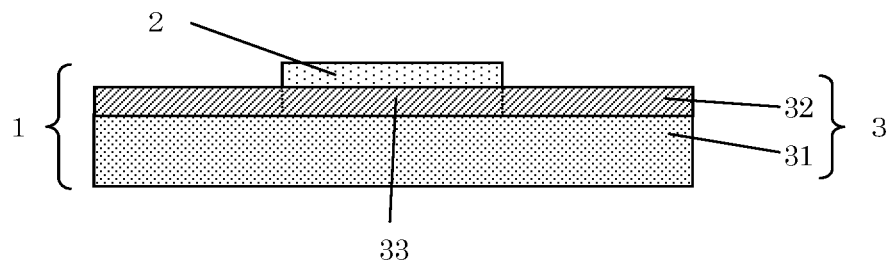
FIG. 1 is a schematic cross-sectional view showing one example of the dicing-tape integrated film for semiconductor back surface according to one embodiment of the present invention.

Embodiments of the present invention are described with reference to the drawings, but the invention is not limited to these embodiments. Incidentally, in the drawings in the present specification, parts which are unnecessary for the description are not given, and some parts are magnified or minified in order to make the description easy.

Hereinafter, an embodiment in which a film for semiconductor back surface is laminated on a dicing tape will be mainly described. FIG. 1 is a schematic cross-sectional view showing one example of a dicing tape-integrated film for semiconductor back surface according to the present embodiment. The film for semiconductor back surface can also be suitably utilized alone.

(Dicing Tape-Integrated Film for Semiconductor Back Surface)

As shown in FIG. 1, a dicing tape-integrated film 1 for semiconductor back surface has a configuration including: a dicing tape 3 including a base material 31 and a pressure-sensitive adhesive layer 32 formed on the base material 31, and a film 2 for semiconductor back surface formed on the pressure-sensitive adhesive layer and being suitable for flip chip type semiconductors. As shown in FIG. 1, the dicing-tape integrated film for semiconductor back surface of the present invention may have a configuration in which the film 2 for semiconductor back surface is formed only on a portion 33 corresponding to a pasting portion of a semiconductor wafer on the pressure-sensitive adhesive layer 32 of the dicing tape 3. However, it may have a configuration in which the film for semiconductor back surface is formed on the entire surface of the pressure-sensitive adhesive layer 32 or it may have a configuration in which the film for semiconductor back surface is formed on a portion larger than the portion 33 corresponding to the pasting portion of a semiconductor wafer and smaller than the entire surface of the pressure-sensitive adhesive layer 32. Further, the surface of the film 2 for semiconductor back surface (the surface that is pasted to the back surface of a wafer) may be protected by a separator, etc. until it is pasted to the back surface of a wafer.

(Film for Semiconductor Back Surface)

The film 2 for semiconductor back surface (see FIG. 1) has a film shape. The film 2 for semiconductor back surface is suitably used in order to protect the back surface of a semiconductor element such as a semiconductor chip and improve the strength of the semiconductor element. The film 2 for semiconductor back surface is usually in an uncured state (including a semi-cured state) in both a form of the film alone and a form of the dicing tape-integrated film for semiconductor back surface. The film 2 for semiconductor back surface is thermally cured after being bonded to the semiconductor wafer.

The film for semiconductor back surface preferably has an adhering strength (70° C., peeling angle: 180 degrees, peel rate: 300 mm/min) to the semiconductor wafer of 7 N/10 mm or less, more preferably 0.5 N/10 mm to 6.5 N/10 mm, and even more preferably 1.0 N/10 mm to 6.0 N/10 mm. When the adhering strength is set within the above-mentioned range, reworkability is improved while the adhesion of the film for semiconductor back surface to the semiconductor wafer is maintained.

The film for semiconductor back surface preferably has a rupture elongation at 25° C. of 700% or less, more preferably 50% or more and 600% or less, and even more preferably 100% or more and 500% or less. By setting the rupture elongation within the above-mentioned range, unintentional stretching and rupture are prevented when the film for semiconductor back surface is peeled from the semiconductor wafer, which can provide a further improvement in reworkability.

The film for semiconductor back surface preferably has a degree of swelling due to ethanol of 1% by weight or more, more preferably 1.5% by weight or more, and even more preferably 2.0% by weight or more. The degree of swelling is preferably 100% by weight or less, and more preferably 50% by weight or less. Thereby, when the film for semiconductor back surface is peeled from the semiconductor wafer, the film for semiconductor back surface can be swollen due to ethanol, which can provide a further improvement in reworkability.

<Method for Measuring Degree of Swelling>

About 0.1 g of a sample is sampled from the film for semiconductor back surface and precisely weighed (weight of sample) and, after the sample is wrapped in a mesh sheet, it is immersed in about 50 mL of ethanol at room temperature for 1 week. Thereafter, a solvent-insoluble matter (content in the mesh sheet) is taken out of ethanol and air-dried at room temperature until the weight change reaches 1% or less. The solvent-insoluble matter after air drying is weighed (weight W1 after immersing and air drying). Then, the solvent-insoluble matter is dried by heating at 130° C. for about 2 hours, and the solvent-insoluble matter after drying is weighed (weight W2 after immersing and drying by heating). A degree of swelling (% by weight) is calculated according to the following expression (a).

$$\text{Degree of swelling (\% by weight)} = [(W1-W2)/W2] \times 100 \tag{a}$$

The degree of swelling of the film for semiconductor back surface can be controlled by the kind and content of the resin components and the kind and content of the crosslinking agent, and besides, heating temperature, heating time, and the like.

Preferably, the film 2 for semiconductor back surface is made from at least a thermosetting resin, and more preferably made from at least a thermosetting resin and a thermoplastic resin. A thermal curing-accelerating catalyst may be incorporated in the resin which constitutes the film 2 for semiconductor back surface. When the film 2 for semiconductor back surface is made from at least a thermosetting resin, the film 2 for semiconductor back surface can effectively exhibit its adhesive function.

Examples of the thermoplastic resin include a natural rubber, a butyl rubber, an isoprene rubber, a chloroprene rubber, an ethylene-vinyl acetate copolymer, an ethylene-acrylate copolymer, an ethylene-acrylic ester copolymer, a polybutadiene resin, a polycarbonate resin, a thermoplastic polyimide resin, polyamide resins such as 6-nylon and 6,6-nylon, a phenoxy resin, an acrylic resin, saturated polyester resins such as PET (polyethylene terephthalate) and PBT (polybutylene terephthalate), a polyamideimide resin, and a fluororesin. The thermoplastic resins can be used alone or two types or more can be used together. Of these thermoplastic resins, acrylic resin is particularly preferable since the resin contains ionic impurities in only a small amount and has a high heat resistance so as to make it possible to ensure the reliability of the semiconductor element.

The acrylic resin is not especially limited, and examples thereof include a polymer having one type or two types or more of acrylates or methacrylates having a linear or branched alkyl group having 30 or less carbon atoms (preferably 4 to 18 carbon atoms, further preferably 6 to 10 carbon atoms, and especially preferably 8 or 9 carbon atoms) as a component. That is, the acrylic resin of the present invention has a broad meaning and also includes a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (a lauryl group), a tridecyl group, a tetradecyl group, a stearyl group, and an octadecyl group.

Other monomers that can form the above-described acrylic resin (monomers other than an alkylester of acrylic acid or methacrylic acid having an alkyl group having 30 or less carbon atoms) are not especially limited. Examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl) methylacrylate; monomers which contain a sulfonic acid group, such as styrenesulfonic acid, allylsulfonic acid, 2-(meth)acrylamide-2-methylpropanesulfonic acid, (meth)acrylamidepropane sulfonic acid, sulfopropyl (meth)acrylate, and (meth)acryloyloxynaphthalenesulfonic acid; and monomers which contain a phosphoric acid group, such as 2-hydroxyethylacryloyl phosphate. (Meth)acrylate refers to an acrylate and/or a methacrylate, and every "(meth)" in the present invention has the same meaning.

Examples of the thermosetting resin include an epoxy resin, a phenol resin, an amino resin, an unsaturated polyester resin, a polyurethane resin, a silicone resin, and a thermosetting polyimide resin. The thermosetting resins can be used alone or two types or more can be used together. An epoxy resin having a small amount of ionic impurities that erode the semiconductor element is especially suitable as the thermosetting resin. Further, a phenol resin can be suitably used as a curing agent for the epoxy resin.

The epoxy resin is not especially limited, and examples thereof include bifunctional epoxy resins and polyfunctional epoxy resins such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a bisphenyl type epoxy resin, a naphthalene type epoxy resin, a fluorene type epoxy resin, a phenol novolak type epoxy resin, an ortho-cresol novolak type epoxy resin, a trishydroxyphenylmethane type epoxy resin, and a tetraphenylolethane type epoxy resin, a hydantoin type epoxy resin, a trisglycidylisocyanurate type epoxy resin, and a glycidylamine type epoxy resin.

Among the above-described epoxy resins, a novolak type epoxy resin, a biphenyl type epoxy resin, a trishydroxyphenylmethane type epoxy resin, and a tetraphenylolethane type epoxy resin are especially preferable. These epoxy resins are highly reactive with a phenol resin as a curing agent and are excellent in heat resistance.

The phenol resin acts as a curing agent for the epoxy resin, and examples thereof include novolak type phenol resins such as a phenol novolak resin, a phenol aralkyl resin, a cresol novolak resin, a tert-butylphenol novolak resin, and a nonylphenol novolak resin, a resol type phenol resin, and polyoxystyrenes such as polyparaoxystyrene. The phenol resins can be used alone or two types or more can be used together. Among these phenol resins, a phenol novolak resin and a phenol aralkyl resin are especially preferable because connection reliability of the c can be improved.

The phenol resin is suitably compounded in the epoxy resin so that a hydroxyl group in the phenol resin to 1 equivalent of an epoxy group in the epoxy resin component becomes 0.5 to 2.0 equivalents. The ratio is more preferably 0.8 to 1.2 equivalents. When the compounding ratio goes out of this range, sufficient curing reaction does not proceed, and the characteristics of the epoxy resin cured substance easily deteriorate.

The content of the thermosetting resin is preferably 5% by weight or more and 90% by weight or less, more preferably 10% by weight or more and 85% by weight or less, and even more preferably 15% by weight or more and 80% by weight or less based on all the resin components in the adhesive layer. When the content is 5% by weight or more, the shrinkage due to thermal curing may be readily controlled to be 2% by volume or more. In thermally curing the sealing resin, the adhesive layer may be fully thermally cured so as to be surely adhered and fixed to the back surface of a semiconductor element. Thus, a flip chip type semiconductor device with no peeling can be produced. On the other hand, when the content is 90% by weight or less, the package (PKG, flip chip type semiconductor device) may be prevented from warping.

A thermal curing accelerating catalyst for an epoxy resin and a phenol resin is not especially limited, and the catalyst can be appropriately selected from known thermal curing accelerating catalysts. The thermal curing accelerating catalysts can be used alone or two types or more can be used together. Examples of the thermal curing accelerating catalyst include an amine curing accelerator, a phosphorus curing accelerator, an imidazole curing accelerator, a boron curing accelerator and a phosphorus-boron curing accelerator.

The film for semiconductor back surface is suitably formed of a resin composition containing an epoxy resin and a phenol resin and a resin composition containing an epoxy resin, a phenol resin, and an acrylic resin. Because these resins have few ionic impurities and high heat resistance, reliability of the semiconductor element can be ensured.

It is important that the film 2 for semiconductor back surface has tackiness (adhesion) to the back surface (the surface where a circuit is not formed) of a semiconductor wafer. The film 2 for semiconductor back surface can be formed of a resin composition containing an epoxy resin as a thermosetting resin, for example. A polyfunctional compound that reacts with a functional group of the end of the polymer molecular chain is preferably added as a crosslinking agent to crosslink the film 2 for semiconductor back surface to some extent in advance. With this operation, the adhesion characteristics under high temperature can be improved and the heat resistance can be improved.

The crosslinking agent is not especially limited, and a known crosslinking agent can be used. Specific examples thereof include an isocyanate crosslinking agent, an epoxy crosslinking agent, a melamine crosslinking agent, a peroxide crosslinking agent, a urea crosslinking agent, a metal alkoxide crosslinking agent, a metal chelate crosslinking agent, a metal salt crosslinking agent, a carbodiimide crosslinking agent, an oxazoline crosslinking agent, an aziridine crosslinking agent, and an amine crosslinking agent. An isocyanate crosslinking agent and an epoxy crosslinking agent are preferable. The crosslinking agents can be used alone or two type or more can be used together.

Examples of the isocyanate crosslinking agent include lower aliphatic polyisocyanates such as 1,2-ethylene diisocyanate, 1,4-butylene isocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylene diisocyanate; and aromatic polyisocyanates such as 2,4-tolylene diisocyanate, 2,6-tolylene diisocyanate, 4,4'-diphenylmethanediisocyanate, and xylylene diisiocyanate. A trimethylolpropane/tolylene diisocyanate trimer adduct (tradename: Coronate L manufactured by Nippon Polyurethane Industry Co., Ltd.) and a trimethylolpropane/hexamethylene diisocyanate trimer adduct (tradename: Coronate HL manufactured by Nippon Polyurethane Industry Co., Ltd.) can also be used. Examples of the epoxy crosslinking agent include N,N,N',N'-tetraglycidyl-m-xylenediamine, diglycidylaniline, 1,3-bis(N,N-glycidylaminomethyl)cyclohexane, 1,6-hexanediol diglycidylether, neopentylglycol diglycidylether, ethyleneglycol diglycidylether, propyleneglycol diglycidylether, polyethyleneglycol diglycidylether, polypropyleneglycol diglycidylether, sorbitol polyglycidylether, glycerol polyglycidylether, pentaerythritol polyglycidylether, polyglyserol polyglycidylether, sorbitan polyglycidylether, trimethylolpropane polyglycidylether, diglycidyl adipate, diglycidyl o-phthalate, triglycidyl-tris(2-hydroxyethyl)isocyanurate, resorcin diglycidylether, bisphenol-s-diglycidyl ether, and an epoxy resin having two or more epoxy groups in the molecule.

The used amount of the crosslinking agent is not especially limited, and can be appropriately selected according to the level of crosslinking. Specifically, the used amount of the crosslinking agent is normally preferably 7 parts by weight or less (0.05 to 7 parts by weight, for example) to 100 parts by weight of a polymer component (especially, a polymer having a functional group at the end of the molecular chain) for example. When the used amount of the crosslinking agent is more than 7 parts by weight to 100 parts by weight of the polymer component, it is not preferable because the adhering strength decreases. From the viewpoint of improving cohesive strength, the used amount of the crosslinking agent is preferably 0.05 parts by weight or more to 100 parts by weight of the polymer component.

In the present invention, it is possible to perform a crosslinking treatment by irradiation with an electron beam, an ultraviolet ray, or the like in place of using the crosslinking agent or together with a crosslinking agent.

The film for semiconductor back surface is preferably colored. With this configuration, the films for semiconductor back surface can exhibit an excellent marking property and an excellent appearance, and a semiconductor device can be obtained having an appearance with added value. Because the colored film for semiconductor back surface has an excellent marking property, various information such as character information and pattern information can be given to a semiconductor device or the surface where a circuit is not formed of the semiconductor device in which the semiconductor element is marked through the film for semiconductor back surface using various marking methods such as a printing method and a laser marking method. Especially, the information such as character information and pattern information that is given by marking can be recognized visually with excellent visibility by controlling the color. Because the film for semiconductor back surface is colored, the dicing tape and the film for semiconductor back surface can be easily distinguished, and workability can be improved. It is possible to color-code the semiconductor device byproduct, for example. When the film for semiconductor back surface is colored (when it is not colorless or transparent), the color is not especially limited. However, the color is preferably a dark color such as black, blue, or red, and black is especially preferable.

In this embodiment, the dark color means a dark color having L* that is defined in the L*a*b* color system of basically 60 or less (0 to 60), preferably 50 or less (0 to 50) and more preferably 40 or less (0 to 40).

The black color means a blackish color having L* that is defined in the L*a*b* color system of basically 35 or less (0 to 35), preferably 30 or less (0 to 30) and more preferably 25 or less (0 to 25). In the black color, each of a* and b* that is defined in the L*a*b* color system can be appropriately selected according to the value of L*. For example, both of a* and b* are preferably −10 to 10, more preferably −5 to 5, and especially preferably −3 to 3 (above all, 0 or almost 0).

In this embodiment, L*, a*, and b* that are defined in the L*a*b* color system can be obtained by measurement using a colorimeter (tradename: CR-200 manufactured by Konica Minolta Holdings, Inc.). The L*a*b* color system is a color space that is endorsed by Commission Internationale de l'Eclairage (CIE) in 1976, and means a color space that is called a CIE1976 (L*a*b*) color system. The L*a*b* color system is provided in JIS Z 8729 in the Japanese Industrial Standards.

When the film for semiconductor back surface is colored, color materials (coloring agents) may be used depending on intended color. Various dark color materials such as black color materials, blue color materials, and red color materials can be preferably used, and black color materials are especially preferable. The color materials include any of pigments, dyes, etc. The color materials may be used either alone or in combination of two or more types. Further, the dyes can be used in any form of acid dyes, reactive dyes, direct dyes, disperse dyes, cationic dyes, etc. Further, the form of the pigments is not especially limited, and it can be appropriately selected from the known pigments and used.

When dyes are used as the color materials, the films for semiconductor back surface (consequently a dicing-tape integrated film for semiconductor back surface) having uniform or almost uniform coloring concentration can be easily manufactured because the dyes disperse uniformly or almost uniformly due to dissolution in the films for semiconductor back surface. Because of that, when the dyes are used as the color materials, the coloring concentration of the film for semiconductor back surface in the dicing tape-integrated film for semiconductor back surface can be made uniform or almost uniform, and the marking property and the appearance can be improved.

The black color material is not especially limited, and can be appropriately selected from inorganic black pigments and black dyes, for example. The black color material may be a color material mixture in which a cyan color material (blue-green color material), a magenta color material (red-purple color material), and a yellow color material are mixed together. The black color materials can be used alone or two types or more can be used together. The black color materials can be used also with other color materials other than black.

Specific examples of the black color materials include carbon black such as furnace black, channel black, acetylene black, thermal black, and lamp black, graphite (black lead), copper oxide, manganese dioxide, azo pigments such as azomethine azo black, aniline black, perylene black, titanium black, cyanine black, activated carbon, ferrite such as nonmagnetic ferrite and magnetic ferrite, magnetite, chromium oxide, iron oxide, molybdenum disulfide, chromium complex, complex oxide black, and anthraquinone organic black.

In the present invention, black dyes such as C. I. solvent black 3, 7, 22, 27, 29, 34, 43, and 70, C. I. direct black 17, 19, 22, 32, 38, 51, and 71, C. I. acid black 1, 2, 24, 26, 31, 48, 52, 107, 109, 110, 119, and 154, and C. I. disperse black 1, 3, 10, and 24; and black pigments such as C. I. pigment black 1 and 7 can be used as the black color material.

For example, trade name "Oil Black BY", trade name "Oil Black BS", trade name "Oil Black HBB", trade name "Oil Black 803", trade name "Oil Black 860", trade name "Oil Black 5970", trade name "Oil Black 5906" and trade name "Oil Black 5905" (manufactured by Orient Chemical Industries Co., Ltd.) and so on are commercially available as the black color material.

Examples of color materials other than the black color materials include a cyan color material, a magenta color material, and a yellow color material. Examples of the cyan color material include cyan dyes such as C. I. solvent blue 25, 36, 60, 70, 93, and 95; and C. I. acid blue 6 and 45; and cyan pigments such as C. I. pigment blue 1, 2, 3, 15, 15:1, 15:2, 15:3, 15:4, 15:5, 15:6, 16, 17, 17:1, 18, 22, 25, 56, 60, 63, 65, and 66; C. I. vat blue 4 and 60; and C. I. pigment green 7.

Examples of the magenta color material include magenta dyes such as C. I. solvent red 1, 3, 8, 23, 24, 25, 27, 30, 49, 52, 58, 63, 81, 82, 83, 84, 100, 109, 111, 121, and 122; C. I. disperse red 9; C. I. solvent violet 8, 13, 14, 21, and 27; C. I. disperse violet 1; C. I. basic red 1, 2, 9, 12, 13, 14, 15, 17, 18, 22, 23, 24, 27, 29, 32, 34, 35, 36, 37, 38, 39, and 40; and C. I. basic violet 1, 3, 7, 10, 14, 15, 21, 25, 26, 27, and 28.

Examples of the magenta color material include magenta pigments such as C. I. pigment red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, and 245; C. I. pigment violet 3, 9, 19, 23, 31, 32, 33, 36, 38, 43, and 50; and C. I. vat red 1, 2, 10, 13, 15, 23, 29, and 35.

Examples of the yellow color material include yellow dyes such as C. I. solvent yellow 19, 44, 77, 79, 81, 82, 93, 98, 103, 104, 112, and 162; and yellow pigments such as C. I. pigment orange 31 and 43, C. I. pigment yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, and 195, and C. I. vat yellow 1, 3, and 20.

Various color materials such as cyan color materials, magenta color materials, and yellow color materials can be used alone or two types or more can be used together. When two types or more of various color materials such as cyan color materials, magenta color materials, and yellow color materials are used, the mixing ratio or the compounding ratio of these color materials is not especially limited, and can be appropriately selected according to the types of each color material and the intended color.

When the film 2 for semiconductor back surface is colored, the colored form is not particularly limited. The film for semiconductor back surface may be, for example, a single-layer film-shaped article containing a coloring agent. The film may be a laminated film including at least a resin layer made from at least a thermosetting resin and a coloring agent layer. When the film 2 for semiconductor back surface is a laminated film of the resin layer and the coloring agent layer, the film 2 for semiconductor back surface in the laminated form preferably has a laminated form of a resin layer/a coloring agent layer/a resin layer. In this case, two resin layers at both sides of the coloring agent layer may be resin layers having the same composition or may be resin layers having different compositions.

Other additives can be appropriately compounded in the film 2 for semiconductor back surface as necessary. Examples of the other additives include a filler, a flame retardant, a silane coupling agent, an ion trapping agent, an extender, an anti-aging agent, an antioxidant, and a surfactant.

The filler may be any of an inorganic filler and an organic filler. However, an inorganic filler is preferable. By adding a filler such as an inorganic filler, electric conductivity can be given to the film for semiconductor back surface, heat conductivity can be improved, and the elastic modulus can be adjusted. The film 2 for semiconductor back surface may be electrically conductive or non-conductive. Examples of the inorganic filler include ceramics such as silica, clay, gypsum, calcium carbonate, barium sulfate, alumina oxide, beryllium oxide, silicon carbide, and silicon nitride, metals such as aluminum, copper, silver, gold, nickel, chromium, lead, tin, zinc, palladium, and solder, alloys, and various inorganic powders consisting of carbon. The fillers may be used alone or two types or more can be used together. Among these, silica, especially molten silica is preferable. The average particle size of the inorganic filler is preferably in a range of 0.1 to 80 μm. The average particle size of the inorganic filler is measured with a laser diffraction type particle size distribution device.

When the film for semiconductor back surface contains the acrylic resin, the amount of the filler (in particular, an inorganic filler) blended is preferably 50 parts by weight to 200 parts by weight, and more preferably 60 parts by weight to 180 parts by weight based on 100 parts by weight of the acrylic resin.

Examples of the flame retardant include antimony trioxide, antimony pentoxide, and a brominated epoxy resin. These can be used alone or two types or more can be used together. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These compounds can be used alone or two types or more can be used together. Examples of the ion trap agent include hydrotalcites and bismuth hydroxide. These can be used alone or two types or more can be used together.

The film 2 for semiconductor back surface can be formed by a common method of preparing a resin composition by mixing a thermosetting resin such as an epoxy resin, a thermoplastic resin such as an acrylic resin as necessary, and a solvent and other additives as necessary and forming the resin composition into a film-like layer.

When the film 2 for semiconductor back surface is formed of a resin composition containing a thermosetting resin such as an epoxy resin, the thermosetting resin in the film for semiconductor back surface is uncured or is partially cured at the stage before application to a semiconductor wafer. In this case, the thermosetting resin in the film for semiconductor back surface is completely cured or almost completely cured after application to a semiconductor wafer (normally when curing a sealing material in a flip-chip bonding step).

When the film for semiconductor back surface in the present invention is a film that is formed with a resin composition containing a thermosetting resin such as an epoxy resin, adhesion to a semiconductor wafer can be exhibited effectively.

Since cutting water is used in the dicing step of the semiconductor wafer, the film for semiconductor back surface absorbs moisture to have a moisture content more than usual in some cases. When flip chip bonding is performed with such a high moisture content, water vapor remains at the adhesion interface between the film 2 for semiconductor back surface and the semiconductor wafer or a processed product thereof (semiconductor) and lifting is generated in some cases. Therefore, by using a film for semiconductor back surface having a configuration in which a core material having high moisture permeability is provided on each surface thereof, water vapor diffuses and thus it becomes possible to avoid such a problem. From such a viewpoint, a multilayered structure in which the films 2 and 12 for semiconductor back surface are formed on one surface or both surfaces of the core material may be used as the film for semiconductor back surface. Examples of the core material include films (e.g., polyimide films, polyester films, polyethylene terephthalate films, polyethylene naphthalate films, and polycarbonate films), resin substrates reinforced with a glass fiber or a plastic nonwoven fiber, silicon substrates, and glass substrates.

The thickness of the film 2 for semiconductor back surface (total thickness in the case of a laminated film) is not especially limited. However, it can be appropriately selected from a range of about 2 μm to 200 μm. The thickness is preferably about 4 μm to 160 μm, more preferably about 6 μm to 100 μm, and especially preferably about 10 μm to 80 μm.

The tensile storage modulus at 23° C. of the uncured film 2 for semiconductor back surface is preferably 1 GPa or more (1 to 50 GPa, for example), more preferably 2 GPa or more, and especially preferably 3 GPa or more. When the tensile storage modulus is 1 GPa or more, adhesion of the film for semiconductor back surface to a support can be effectively suppressed or prevented when a semiconductor chip is peeled from the pressure-sensitive adhesive layer 32 of a dicing tape together with the film 2 for semiconductor back surface and the film 2 for semiconductor back surface mounted on the support are transported. Examples of the support include a top tape and a bottom tape of a carrier tape. When the film 2 for semiconductor back surface is made from a resin composition containing a thermosetting resin, as described above, the thermosetting resin is usually in an uncured or partially cured state, so that the elastic modulus of the film for semiconductor back surface at 23° C. is usually an elastic modulus at 23° C. in a state where the thermosetting resin is uncured or partially cured.

Here, the film 2 for semiconductor back surface may be either a single layer film or a laminated film including a plurality of layers. In the case of the laminated film, the tensile storage elastic modulus at 23° C. in an uncured state should be 1 GPa or more (e.g., 1 GPa to 50 GPa) as the whole laminated film. The tensile storage elastic modulus (23° C.) of the film for semiconductor back surface in an uncured state can be controlled by the kind and content of the resin components (thermoplastic resin and thermosetting resin) or the kind and content of a filler such as a silica filler. When the film 2 for semiconductor back surface is a laminated film in which a plurality of layers are laminated (when the film for semiconductor back surface has a form of laminated layers), an example of the form of laminated layers includes a form of laminated layers consisting of a wafer adhesion layer and a laser marking layer. Other layers such as an intermediate layer, a light beam shielding layer, a reinforcing layer, a coloring agent layer, a base layer, an electromagnetic wave shielding layer, a heat conducting layer, and a pressure-sensitive adhesive layer may be provided between the wafer adhesion layer and the laser marking layer. The wafer adhesion layer is a layer having excellent adhesion (tackiness) to a wafer and contacting with the back surface of the wafer. The laser marking layer is a layer having an excellent laser marking property and is used to perform laser marking on the back surface of a semiconductor chip.

The uncured films 2 for semiconductor back surface is produced without laminating the films on the dicing tape 3, and the tensile storage modulus is measured using a dynamic viscoelasticity measurement apparatus (Solid Analyzer RS A2) manufactured by Rheometric Scientific FE, Ltd. in tensile mode, sample width 10 mm, sample length 22.5 mm, sample thickness 0.2 mm, frequency 1 Hz, temperature rise rate 10° C./min, under a nitrogen atmosphere, and at a prescribed temperature (23° C.)

Preferably, the film 2 for semiconductor back surface is protected with a separator (release liner) on at least one surface thereof (not shown in the drawings). For example, in the case of the dicing tape-integrated film 1 for semiconductor back surface, a separator may be provided on only one surface of the film for semiconductor back surface. On the other hand, in the case of the film for semiconductor back surface not integrated with a dicing tape, a separator may be provided on one surface or both surfaces of the film for semiconductor back surface. The separator has a function as a protective material for protecting the film for semiconductor back surface until the film is practically used. In the case of the dicing tape-integrated film 1 for semiconductor back surface, the separator may further serve as a supporting base material in transferring the film 2 for semiconductor back surface onto the pressure-sensitive adhesive layer 32 on the base material of the dicing tape. The separator is peeled when pasting the semiconductor wafer onto the film for semiconductor back surface. Examples of the separator include polyethylene, polypropylene, a plastic film such as polyethylene terephthalate whose surface is coated with a release agent such as a fluorine release agent or a long chain alkylacrylate release agent, and paper. The separator can be formed by a conventionally known method. The thickness of the separator is also not especially limited.

When the film 2 for semiconductor back surface is not laminated on the dicing tape 3, in a state where the film 2 for semiconductor back surface is wound into a roll along with one separator having a release layer on both surfaces thereof, the film 2 may be protected with the separator having a release layer on both surfaces thereof, or the film 2 may be protected with a separator having a release layer on at least one surface thereof.

The light transmittance (visible light transmittance) of visible light (having a wavelength of 400 to 800 nm) in the film 2 for semiconductor back surface is not especially limited, and is preferably in a range of 20% or less (0 to 20%), more preferably 10% or less (0 to 10%), and especially preferably 5% or less (0 to 5%). When the visible light transmittance of the film 2 for semiconductor back surface is larger than 20%, there is a fear that a bad influence may be given to the semiconductor element when the light beam passes. The visible light transmittance (%) can be controlled by the type and the content of the resin component of the film 2 for semiconductor back surface, the type and the content of the coloring agent such as a pigment or a dye, the content of the inorganic filler, and the like.

The visible light transmittance (%) of the film for semiconductor back surface can be measured as follows. That is, a film for semiconductor back surface having a thickness (average thickness) of 20 μm is produced. The film 2 for semiconductor back surface is then irradiated with visible light having a wavelength of 400 to 800 nm (a visible light generator "ABSORPTION SPECTRO PHOTOMETER" manufactured by Shimadzu Corporation) at a prescribed intensity, and the intensity of the transmitted visible light beam is measured. The visible light transmittance can be obtained from a change of the intensity before and after the visible light beam transmits through the film 2 for semiconductor back surface. It is also possible to obtain the visible light transmittance (%; wavelength: 400 to 800 nm) of the film 2 for semiconductor back surface having a thickness of 20 μm from the visible light transmittance (%; wavelength: 400 to 800 nm) of the film 2 for semiconductor back surface whose thickness is not 20 μm. The visible light transmittance (%) of the film 2 for semiconductor back surface having a thickness of 20 μm is obtained in the present invention. However, the thickness of the film for semiconductor back surface according to the present invention is not limited to 20 μm.

The coefficient of moisture absorption of the film 2 for semiconductor back surface is preferably low. Specifically, the coefficient of moisture absorption is preferably 1% by weight or less, and more preferably 0.8% by weight or less. By making the coefficient of moisture absorption 1% by weight or less, the laser marking property can be improved. Further, generation of voids between the film 2 for semiconductor back surface and the semiconductor element can be suppressed or prevented in a reflow step, for example. The coefficient of moisture absorption is a value calculated from the weight change before and after the film 2 for semiconductor back surface are left under an atmosphere of a temperature of 85° C. and a relative humidity of 85% RH for 168 hours. When the film 2 for semiconductor back surface are formed of a resin composition containing a thermosetting resin, the coefficient of moisture absorption is a value obtained the films for semiconductor back surface after thermal curing are left under an atmosphere of a temperature of 85° C. and a relative humidity of 85% RH for 168 hours. The coefficient of moisture absorption can be adjusted by changing the added amount of the inorganic filler, for example.

The ratio of the volatile component of the film 2 for semiconductor back surface is preferably small. Specifically, the weight decrease rate (ratio of the weight decrease amount) of the film 2 for semiconductor back surface after a heat treatment is preferably 1% by weight or less, and more preferably 0.8% by weight or less. The condition of the heating treatment is a heating temperature of 250° C. and a heating time of 1 hour, for example. By making the weight decrease rate 1% by weight or less, the laser marking property can be improved. The generation of cracks in the flip-chip type semiconductor device can be suppressed or prevented in a reflow step, for example. The weight decrease rate can be adjusted by adding an inorganic substance that can decrease the generation of cracks during a lead free solder reflow, for example. When the film 2 for semiconductor back surface is formed with a resin composition containing a thermosetting resin, the weight decrease rate means a value obtained when the film for semiconductor back surface after thermal curing is heated under conditions of a heating temperature of 250° C. and a heating time of 1 hour.

(Dicing Tape)

The dicing tape 3 has a configuration in which the pressure-sensitive adhesive layer 32 is formed on the base material 31. As described above, the dicing tape 3 may have a configuration in which the base material 31 and the pressure-sensitive adhesive layer 32 are laminated.

(Base Material)

The base material (supporting base material) can be used as a support base body of the pressure-sensitive adhesive layer, and the like. The base material 31 preferably has radiation transparency. Examples of the base material 31 include appropriate thin materials including paper base materials such as paper; fiber base materials such as cloth, unwoven cloth, felt, and net; metal base materials such as a metal foil and a metal plate; plastic base materials such as a plastic film and sheet; rubber base materials such as a rubber sheet; foams such as a foamed sheet, and laminated bodies of these (especially laminated bodies of a plastic base and other base materials and laminated bodies of plastic films or sheets). In the present invention, a plastic base material such as a plastic film or sheet can be preferably used as the base material. Examples of the material of such a plastic base material include olefin resins such as polyethylene (PE), polypropylene (PP), and an ethylene-propylene copolymer; copolymers having ethylene as a monomer component such as a ethylene vinyl acetate copolymer (EVA), an ionomer resin, a ethylene-(meth)acrylate copolymer, and an ethylene-(meth)acrylate (random, alternating) copolymer; polyesters such as polyethylene terephthalate (PET), polyethylene naphthalate (PEN), and polybutylene terephthalate (PBT); an acrylic resin; polyvinyl chloride (PVC); polyurethane; polycarbonate; polyphenylene sulfide (PPS); amide resins such as polyamide (nylon) and fully aromatic polyamide (aramid); polyether ether ketone (PEEK); polyimide; polyetherimide; polyvinylidene chloride; ABS (acrylonitrile-butadiene-styrene copolymer); a cellulose resin; a silicone resin; and a fluororesin.

Further, the material of the base material 31 includes a polymer such as a cross-linked body of the above resins. The above plastic film may be also used unstretched, or may be also used on which a monoaxial or a biaxial stretching treatment is performed depending on necessity. According to resin sheets in which heat shrinkable properties are given by the stretching treatment, etc., the adhesive area of the pressure-sensitive adhesive layer 32 and the film 2 for semiconductor back surface are reduced by thermally shrinking the base material 31 after dicing, and the recovery of the semiconductor chips (a semiconductor element) can be facilitated.

A known surface treatment such as a chemical or physical treatment such as a chromate treatment, ozone exposure, flame exposure, high voltage electric exposure, and an ionized ultraviolet treatment, and a coating treatment by an undercoating agent (for example, a tacky substance described later) can be performed on the surface of the base material 31 in order to improve adhesiveness, holding properties, etc. with the adjacent layer.

The same type or different types can be appropriately selected and used as the base material 31, and several types can be blended and used as necessary. A vapor deposited layer of a conductive substance having a thickness of about 30 to 500 Å consisting of metals, alloys, and oxides of these can be provided on the base material 31 to give an antistatic function to the base material 31. The base material 31 may be a single layer or a multilayer consisting of two types or more layers.

The thickness of the base material 31 (total thickness in the case of a laminated body) is not especially limited, and can be appropriately selected according to the strength, flexibility, purpose of use, and the like. For example, the thickness is generally 1000 μm less (1 to 1000 μm, for example), preferably 10 to 500 μm, more preferably 20 to 300 μm, and especially preferably about 30 to 200 μm. However, the thickness is not limited to these ranges.

The base material 31 may contain various additives such as a coloring agent, a filler, a plasticizer, an anti-aging agent, an antioxidant, a surfactant, and a flame retardant as long as the effects of the present invention are not deteriorated.
(Pressure-Sensitive Adhesive Layer)

The pressure-sensitive adhesive layer 32 is formed with a pressure-sensitive adhesive, and has adherability. The pressure-sensitive adhesive is not especially limited, and can be appropriately selected among known pressure-sensitive adhesives. Specifically, known pressure-sensitive adhesives (refer to Japanese Patent Application Laid-Open Nos. 56-61468, 61-174857, 63-17981, and 56-13040, for example) such as a pressure-sensitive adhesive having the above-described characteristics can be appropriately selected from an acrylic pressure-sensitive adhesive, a rubber pressure-sensitive adhesive, a vinylalkylether pressure-sensitive adhesive, a silicone pressure-sensitive adhesive, a polyester pressure-sensitive adhesive, a polyamide pressure-sensitive adhesive, a urethane pressure-sensitive adhesive, a fluorine pressure-sensitive adhesive, a styrene-diene block copolymer pressure-sensitive adhesive, and a creep property improved pressure-sensitive adhesive in which a hot-melt resin having a melting point of about 200° C. or less is compounded in these pressure-sensitive adhesives. A radiation curing type pressure-sensitive adhesive (or an energy ray curing type pressure-sensitive adhesive) and a thermally expandable pressure-sensitive adhesive can also be used as the pressure-sensitive adhesive. The pressure-sensitive adhesives can be used alone or two types or more can be used together.

An acrylic pressure-sensitive adhesive and a rubber pressure-sensitive adhesive can be suitably used as the pressure-sensitive adhesive, and especially an acrylic pressure-sensitive adhesive is suitable. An example of the acrylic pressure-sensitive adhesive is an acrylic pressure-sensitive adhesive having an acrylic polymer, in which one type or two types or more of alkyl (meth)acrylates are used as a monomer component, as a base polymer.

Examples of alkyl (meth)acrylates in the acrylic pressure-sensitive adhesive include methyl (meth)acrylate, ethyl (meth)acrylate, propyl (meth)acrylate, isopropyl (meth) acrylate, butyl (meth)acrylate, isobutyl (meth)acrylate, s-butyl (meth)acrylate, t-butyl (meth)acrylate, pentyl (meth) acrylate, hexyl (meth)acrylate, heptyl (meth)acrylate, octyl (meth)acrylate, 2-ethylhexyl (meth)acrylate, isooctyl (meth) acrylate, nonyl(meth)acrylate, isononyl(meth)acrylate, decyl (meth)acrylate, isodecyl (meth)acrylate, undecyl (meth)acrylate, dodecyl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, and eicosyl (meth)acrylate. Alkyl (meth)acrylates having an alkyl group of 4 to 18 carbon atoms is suitable. The alkyl group of alkyl (meth)acrylates may be any of linear or branched chain.

The acrylic polymer may contain units that correspond to other monomer components that is copolymerizable with alkyl (meth)acrylates described above (copolymerizable monomer component) for reforming cohesive strength, heat resistance, and crosslinking property, as necessary. Examples of such copolymerizable monomer components include carboxyl group-containing monomers such as (meth)acrylic acid (acrylic acid, methacrylic acid), carboxyethyl acrylate, carboxypentyl acrylate, itaconic acid, maleic acid, fumaric acid, and crotonic acid; acid anhydride group-containing monomers such as maleic anhydride and itaconic anhydride; hydroxyl group-containing monomers such as hydroxyethyl (meth)acrylate, hydroxypropyl (meth)acrylate, hydroxybutyl (meth)acrylate, hydroxyhexyl (meth) acrylate, hydroxyoctyl (meth)acrylate, hydroxydecyl (meth) acrylate, hydroxylauryl (meth)acrylate, and (4-hydroxymethylcyclohexyl)methyl methacrylate; sulfonate group-containing monomers such as styrenesulfonic acid, allylsulfonic acid, 2-(meth)acrylamide-2-methylpropanesulfonic acid, (meth)acrylamidepropanesulfonic acid, sulfopropyl(meth)acrylate, and (meth)acryloyloxynaphthalenesulfonic acid; phosphate group-containing monomers such as 2-hydroxyethylacryloylphosphate; (N-substituted) amide monomers such as (meth)acrylamide, N,N-dimethyl (meth)acrylamide, N-butyl(meth)acrylamide, N-methylol (meth)acrylamide, and N-methylolpropane(meth)acrylamide; aminoalkyl (meth)acrylate monomers such as aminoethyl (meth)acrylate, N,N-dimethylaminoethyl (meth) acrylate, and t-butylaminoethyl (meth)acrylate; alkoxyalkyl (meth)acrylate monomers such as methoxyethyl (meth)acrylate and ethoxyethyl (meth)acrylate; cyanoacrylate monomers such as acrylonitrile and methacrylonitrile; epoxy group-containing acrylic monomers such as glycidyl (meth) acrylate; styrene monomers such as styrene and α-methylstyrene; vinylester monomers such as vinyl acetate and vinyl propionate; olefin monomers such as isoprene, butadiene, and isobutylene; vinylether monomers such as vinylether; nitrogen-containing monomers such as N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarboxylic acid amides, and N-vinylcaprolactam; maleimide monomers such as N-cyclohexylmaleimide, N-isopropylmaleimide, N-laurylmaleimide, and N-phenylmaleimide; itaconimide monomers such as N-methylitaconimide, N-ethylitaconimide, N-butylitaconimide, N-octylitaconimide, N-2-ethylhexylitaconimide, N-cyclohexylitaconimide, and N-laurylitaconimide; succinimide monomers such as N-(meth)acryloyloxymethylene succinimide, N-(meth)acryloyl-6-oxyhexamethylene succinimide, and N-(meth)acryloyl-8-oxyoctamethylene succinimide; glycol acrylester monomers such as polyethylene glycol (meth) acrylate, polypropylene glycol (meth)acrylate, metoxyethylene glycol (meth)acrylate, and metoxypolypropylene glycol (meth)acrylate; acrylate monomers having a heterocyclic ring, a halogen atom, a silicon atom, and the like such as tetrahydrofurfuryl (meth)acrylate, fluorine (meth)acrylate, and silicone (meth)acrylate; and polyfunctional monomers such as hexanediol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylolpropane tri(meth)acrylate, pentaerythritol tri(meth)acrylate, dipentaerythritol hexa(meth)acrylate, epoxyacrylate, polyesteracrylate, urethaneacrylate, divinylbenzene, butyl di(meth)acrylate, and hexyl di(meth)acrylate. One type or two types or more of these copolymerizable monomer components can be used.

When a radiation curing type pressure-sensitive adhesive (or an energy ray curing type pressure-sensitive adhesive) is used as the pressure-sensitive adhesive, examples of the radiation curing type pressure-sensitive adhesive (composition) include an internal radiation curing type pressure-sensitive adhesive having a polymer with a radical reactive carbon-carbon double bond in the polymer side chain, the main chain, or the ends of the main chain as a base polymer and a radiation curing type pressure-sensitive adhesive in which ultraviolet-ray curing-type monomer component and oligomer component are compounded in the pressure-sensitive adhesive. When a thermally expandable pressure-sensitive adhesive is used as the pressure-sensitive adhesive, examples thereof include a thermally expandable pressure-sensitive adhesive containing a pressure-sensitive adhesive and a foaming agent (especially, a thermally expandable microsphere).

The pressure-sensitive adhesive layer 32 of the present invention may contain various additives such as a tackifier, a coloring agent, a thickener, an extender, a filler, a plasticizer, an anti-aging agent, an antioxidant, a surfactant, and a crosslinking agent as long as the effects of the present invention are not deteriorated.

The crosslinking agent is not especially limited, and known crosslinking agents can be used. Specific examples of the crosslinking agent include an isocyanate crosslinking agent, an epoxy crosslinking agent, a melamine crosslinking agent, a peroxide crosslinking agent, a urea crosslinking agent, a metal alkoxide crosslinking agent, a metal chelate crosslinking agent, a metal salt crosslinking agent, a carbodiimide crosslinking agent, an oxazoline crosslinking agent, an aziridine crosslinking agent, and an amine crosslinking agent, and an isocyanate crosslinking agent and an epoxy crosslinking agent are preferable. The crosslinking agents can be used alone or two types or more can be used together. The used amount of the crosslinking agent is not especially limited.

Examples of the isocyanate crosslinking agent include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylene diisocyanate; and aromatic polyisocyanates such as 2,4-tolylene diisocyanate, 2,6-tolylene diisocyanate, 4,4'-diphenylmethane diisocyanate, and xylylene diisocyanate. A trimethylolpropane/tolylene diisocyanate trimeric adduct (Coronate L manufactured by Nippon Polyurethane Industry Co., Ltd.), and a trimethylolpropane/ hexamethylene diisocyanate trimeric adduct (Coronate HL manufactured by Nippon Polyurethane Industry Co., Ltd.) can also be used. Examples of the epoxy crosslinking agent include N,N,N',N'-tetraglycidyl-m-xylenediamine, diglycidylaniline, 1,3-bis(N,N-glycidylaminomethyl)cyclohexane, 1,6-hexanediol diglycidylether, neopentylglycol diglycidylether, ethyleneglycol diglycidylether, propyleneglycol diglycidylether, polyethyleneglycol diglycidylether, polypropyleneglycol diglycidylether, sorbitol polyglycidylether, glycerol polyglycidylether, pentaerythritol polyglycidylether, polyglycerol polyglycidylether, sorbitan polyglycidylether, trimethylolpropane polyglycidylether, diglycidyl adipate, o-diglycidyl phthalate, triglycidyl-tris(2-hydroxyethyl)isocyanurate, resorcin diglycidylether, bisphenol-S-diglycidylether; and an epoxy resin having two or more epoxy groups in a molecule.

In the present invention, a crosslinking treatment can be performed by irradiation with an electron beam, an ultraviolet ray, or the like instead of using the crosslinking agent or in addition to the use of the crosslinking agent.

The pressure-sensitive adhesive layer 32 can be formed by a common method of forming a sheet-like layer by mixing the pressure-sensitive adhesive with a solvent, other additives, and the like as necessary. Specifically, the pressure-sensitive adhesive layer 32 can be produced by a method of applying the pressure-sensitive adhesive or a mixture containing the pressure-sensitive adhesive, a solvent and other additives to the base material 31, a method of forming the pressure-sensitive adhesive layer 32 by applying the above-described mixture to an appropriate separator (release paper, for example), and transferring (adhering) the resultant onto the base material 31, for example.

The thickness of the pressure-sensitive adhesive layer 32 is not particularly limited. For example, the thickness is 5 µm or more and 200 µm or less, preferably 5 µm or more and 50 µm or less, more preferably 5 µm or more and 45 µm or less, and particularly preferably 5 µm or more and 40 µm or less. When the thickness of the pressure-sensitive adhesive layer 32 falls within the above range, the layer may exhibit a suitable adhesive strength, which can provide a sufficient improvement in tackiness between the base material and the pressure-sensitive adhesive layer, and secure the holding force of the semiconductor wafer during dicing. The pressure-sensitive adhesive layer 32 may be either a single layer or a multilayer.

The adhering strength (23° C., peeling angle: 180 degrees, peel rate: 300 mm/min) of the pressure-sensitive adhesive layer 32 of the dicing tape 3 to the film 2 for semiconductor back surface is preferably 0.02 N/20 mm to 10 N/20 mm, and more preferably 0.05 N/20 mm to 5 N/20 mm. When the adhering strength is 0.02 N/20 mm or more, the semiconductor elements can be prevented from chip scattering in dicing a semiconductor wafer. On the other hand, when the adhering strength is 10 N/20 mm or less, the semiconductor elements are difficult to be peeled in being picked up, and the adhesive residue is prevented.

In the present invention, an antistatic function can be given to the film 2 for semiconductor back surface or the dicing-tape integrated film 1 for semiconductor back surface. With this configuration, generation of static electricity on the films during adhesion and peeling and damages of the circuit due to electrification of the semiconductor wafer, and the like can be prevented. The antistatic function can be given by an appropriate method such as a method of adding an antistatic agent or a conductive substance to the base material 31, the pressure-sensitive adhesive layer 32, or the film 2 for semiconductor back surface and a method of providing a conductive layer made of a charge-transfer complex or a metal film to the base material 31. A method of giving the antistatic function is preferable with which impurity ions that can deteriorate the semiconductor wafer are hardly generated. Examples of the conductive substance (conductive filler) that is compounded to give electric conductivity and to improve heat conductivity include spherical, needle-like, and flaky metal powders of silver, aluminum, gold, copper, nickel, and conductive alloys, metal oxides of alumina, amorphous carbon black, and graphite. However, the film 2 for semiconductor back surface is preferably electrically non-conductive from the viewpoint of making the films have no electrical leakage.

The film 2 for semiconductor back surface and the dicing tape-integrated film 1 for semiconductor back surface may be formed in a form in which the films are wound into a roll or a form in which the sheets (films) are laminated. When the films have a form in which they are wound into a roll, the film 2 for semiconductor back surface or the dicing tape-integrated film 1 for semiconductor back surface having a state or form in which the films are wound into a roll can be produced by winding the film 2 for semiconductor back surface or a laminate of the film 2 for semiconductor back surface and the dicing tape 3 into a roll with the film or the laminate being protected with a separator as necessary. The dicing tape-integrated film 1 for semiconductor back surface which is wound into a roll may include the base material 31, the pressure-sensitive adhesive layer 32 which is formed on one surface of the base material 31, a film for semiconductor back surface which is formed on the pressure-sensitive adhesive layer 32, and a release-treated layer (back surface-treated layer) which is formed on the other surface of the base material 31.

The thickness of the dicing tape-integrated film 1 for semiconductor back surface (total of the thickness of the film for semiconductor back surface and the thickness of the dicing tape including the base material 31 and the pressure-sensitive adhesive layer 32) can be, for example, selected from the range of 25 µm to 1,600 µm, and it is preferably 30 µm to 850 µm, more preferably 35 µm to 500 µm, and particularly preferably 50 µm to 330 µm.

In the dicing tape-integrated film 1 for semiconductor back surface, by controlling the ratio of the thickness of the film 2 for semiconductor back surface to the thickness of the pressure-sensitive adhesive layer 32 of the dicing tape 3 or the ratio of the thickness of the film 2 for semiconductor back surface to the thickness of the dicing tape 3 (total thickness of the base material 31 and the pressure-sensitive adhesive layer 32), a dicing property in the dicing step and a pick up property in the picking-up step can be improved, and the dicing tape-integrated film 1 for semiconductor back surface can be effectively utilized from the dicing step of the semiconductor wafer to the flip chip bonding step of the semiconductor chip.

(Method of Producing Dicing Tape-Integrated Film for Semiconductor Back Surface)

A method of producing the dicing tape-integrated film for semiconductor back surface according to this embodiment is explained using the dicing tape-integrated film 1 for semiconductor back surface shown in FIG. 1 as an example. First, the base material 31 can be formed by a conventionally known film forming method. Examples of the film forming method include a calender film forming method, a casting method in an organic solvent, an inflation extrusion method in a closed system, a T die extrusion method, a co-extrusion method, and a dry laminating method.

The pressure-sensitive adhesive layer 32 is formed by applying a pressure-sensitive adhesive composition to the base material 31 and drying the composition (by crosslinking by heat as necessary). Examples of the application method include roll coating, screen coating, and gravure coating. The pressure-sensitive adhesive layer 32 may be formed on the base material 31 by applying the pressure-sensitive adhesive composition directly to the base material 31, or the pressure-sensitive adhesive layer 32 may be transferred to the base material 31 after the pressure-sensitive adhesive layer 32 is formed by applying the pressure-sensitive adhesive composition to a release paper whose surface has been subjected to a release treatment. With this configuration, the dicing tape 3 is produced in which the pressure-sensitive adhesive layer 32 is formed on the base material 31.

On the other hand, a formation material for forming the film 2 for semiconductor back surface is applied onto release paper so that the thickness after drying becomes prescribed thickness, and then, it is dried under a prescribed condition (drying by carrying out a heating treatment when thermal curing is necessary, etc.) to form a coating layer. This coating layer is transferred onto the pressure-sensitive adhesive layer 32 to form the film 2 for semiconductor back surface on the pressure-sensitive adhesive layer 32. Further, a formation material for forming the film 2 for semiconductor back surface is applied directly onto the pressure-sensitive adhesive layer 32, and it is dried under a prescribed condition (drying by carrying out a heating treatment when thermal curing is necessary, etc.) also to form the film 2 for semiconductor back surface on the pressure-sensitive adhesive layer 32. With this, the dicing-tape integrated film 1 for semiconductor back surface according to the present invention can be obtained. When thermal curing is performed to form the film 2 for semiconductor back surface, it is important to perform thermal curing up to a level at which the film is partially cured. However, it is preferable not to perform thermal curing.

The dicing tape-integrated film 1 for semiconductor back surface can be used suitably in the manufacture of a semiconductor device having a flip-chip connecting step. The dicing tape-integrated film 1 for semiconductor back surface of the present invention is used to manufacture a flip-chip mounted semiconductor device, and the flip-chip mounted semiconductor device is manufactured in a form in which the film 2 for semiconductor back surface of the dicing tape-integrated film 1 for semiconductor back surface is pasted to the back surface of the semiconductor chip. Therefore, the dicing tape-integrated film 1 for semiconductor back surface of the present invention can be used for a flip-chip mounted semiconductor device (a semiconductor device in a form in which the semiconductor chip is fixed to an adherend such as a substrate by a flip-chip bonding method).

As in the dicing tape-integrated film 1 for semiconductor back surface, the film 2 for semiconductor back surface can be used for a flip chip-mounted semiconductor device (a semiconductor device in a state or form where the semiconductor chip is fixed to an adherend such as a substrate by a flip chip bonding method).

(Semiconductor Wafer)

The semiconductor wafer is not especially limited as long as it is a known or common semiconductor wafer, and semiconductor wafers made of various materials can be appropriately selected and used. In the present invention, a silicon wafer can be suitably used as the semiconductor wafer.

(Method for Producing Semiconductor Device)

Hereinafter, the method for producing a semiconductor device according to the present embodiment will be described with reference to FIGS. 2A to 2D. FIGS. 2A to 2D are schematic cross-sectional views each showing one step of a method for producing a semiconductor device when the dicing tape-integrated film 1 for semiconductor back surface is used.

In the semiconductor device producing method, the dicing tape-integrated film 1 for semiconductor back surface can be used to produce a semiconductor device. Specifically, the producing method includes at least a step of bonding a semiconductor wafer onto the film for semiconductor back surface in the dicing tape-integrated film for semiconductor back surface, a step of dicing the semiconductor wafer with a cutting depth so controlled as to fall within a range overstepping one surface of the pressure-sensitive adhesive layer that faces the film for semiconductor back surface and not reaching another surface thereof that faces the base material to form a semiconductor chip, a peeling step of peeling the semiconductor chip from the pressure-sensitive adhesive layer of the dicing tape together with the film for semiconductor back surface, and a step of flip chip-connecting the semiconductor chip onto an adherend.

[Mounting Step]

Figure 2A:
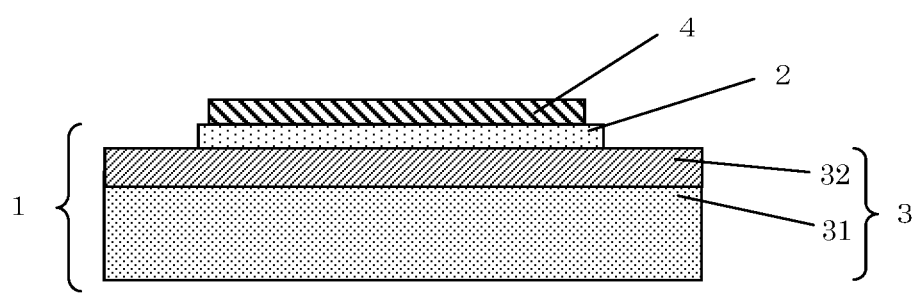
FIG. 2A is a schematic cross-sectional view showing one example of the method of manufacturing a semiconductor device using the dicing-tape integrated film for semiconductor back surface according to one embodiment of the preset invention.

As shown in FIG. 2A, the separator that is appropriately provided on the film 2 for semiconductor back surface of the dicing-tape integrated film 1 for semiconductor back surface is appropriately peeled off, a semiconductor wafer 4 is pasted to the film 2 for semiconductor back surface, and the laminate is fixed by adhering and holding (mounting step). At this time, the film 2 for semiconductor back surface is uncured (including a condition of being partially cured). The dicing-tape integrated film 1 for semiconductor back surface is pasted to the back surface of the semiconductor wafer 4. The back surface of the semiconductor wafer 4 means the surface opposite to the circuit surface (also referred to as a non-circuit surface or a non-electrode forming surface). The pasting method is not especially limited, and a pasting method by pressure-bonding is preferable. The pressure-bonding is performed by pressing by a pressing means such as a press roll.

[Dicing Step]

Figure 2B:
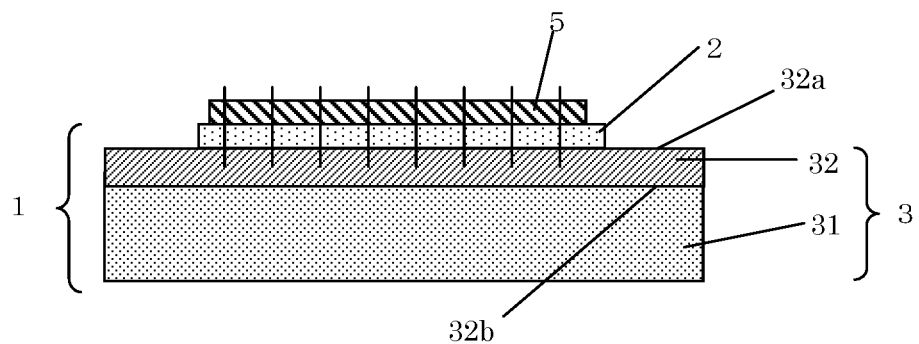
FIG. 2B is a schematic cross-sectional view showing one example of the method of manufacturing a semiconductor device using the dicing-tape integrated film for semiconductor back surface according to one embodiment of the preset invention.

As shown in FIG. 2B, dicing of the semiconductor wafer 4 is performed. With this operation, the semiconductor wafer 4 is cut into individual pieces (cut into small pieces) having a prescribed size, and a semiconductor chip 5 is manufactured. The dicing is performed from the circuit surface side of the semiconductor wafer 4 by a normal method, for example. For example, a cutting method called full cut in which cutting is performed up to the dicing-tape integrated film 1 for semiconductor back surface can be adopted in this step. The dicing apparatus used in this step is not especially limited, and a conventionally known apparatus can be used. Because the semiconductor wafer 4 is adhered and fixed with excellent adhesion by the dicing-tape integrated film 1 for semiconductor back surface having the film for semiconductor back surface, chip cracks and chip fly can be suppressed and damages to the semiconductor wafer 4 can also be suppressed. When the film 2 for semiconductor back surface is made from a resin composition containing an epoxy resin, the generation of adhesive protrusion from the adhesive layer of the film for semiconductor back surface can be suppressed or prevented on the cut surface even when the film 2 is cut by dicing. As a result, re-attachment (blocking) of the cut surfaces can be suppressed or prevented, and thus the picking-up to be described below can be further successfully performed.

When expanding the dicing-tape integrated film 1 for semiconductor back surface, a conventionally known expanding apparatus can be used. The expanding apparatus has a donut-shaped outer ring that can push down the dicing-tape integrated film 1 for semiconductor back surface through a dicing ring and an inner ring that has a smaller diameter than the outer ring and that supports the dicing tape-integrated film for semiconductor back surface. With this expanding step, generation of damages caused by the contact between adjacent semiconductor chips can be prevented in the pickup step described later.

[Pickup Step]

Figure 2C:
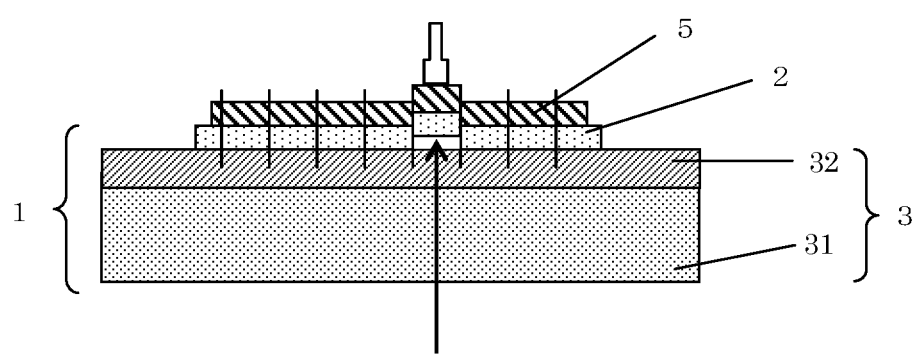
FIG. 2C is a schematic cross-sectional view showing one example of the method of manufacturing a semiconductor device using the dicing-tape integrated film for semiconductor back surface according to one embodiment of the preset invention.

The semiconductor chip 5 is peeled from the dicing tape 3 together with the film 2 for semiconductor back surface by performing pickup of the semiconductor chip 5 as shown in FIG. 2C to collect the semiconductor chip 5 that is adhered and fixed to the dicing-tape integrated film 1 for semiconductor back surface. The pickup method is not especially limited, and various conventionally known methods can be adopted. An example of the method is a method of pushing up an individual semiconductor chip 5 from the side of the base material 31 of the dicing-tape integrated film 1 for semiconductor back surface with a needle and picking up the pushed semiconductor chip 5 with a pickup apparatus. The back surface of the semiconductor chip 5 that is picked up is protected by the film 2 for semiconductor back surface.

[Flip-Chip Connecting Step]

Figure 2D:
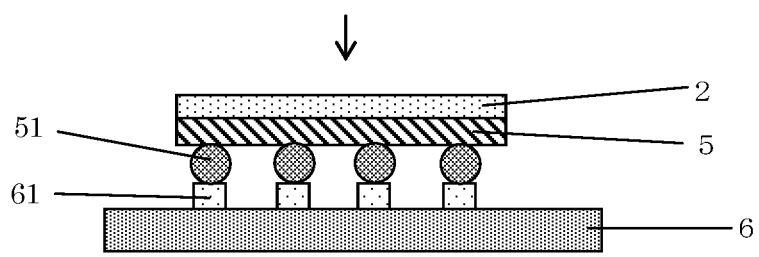
FIG. 2D is a schematic cross-sectional view showing one example of the method of manufacturing a semiconductor device using the dicing-tape integrated film for semiconductor back surface according to one embodiment of the preset invention.

As shown in FIG. 2D, the semiconductor chip 5 that is picked up is fixed to an adherend such as a substrate by a flip-chip bonding method (flip-chip mounting method). Specifically, the semiconductor chip 5 is fixed to an adherend 6 by a normal method in a form that the circuit surface (also referred to as the surface, a circuit pattern forming surface, or an electrode forming surface) of the semiconductor chip 5 faces the adherend 6. The semiconductor chip 5 can be fixed to the adherend 6 while securing electrical conduction of the semiconductor chip 5 with the adherend 6 by contacting and pressing a bump 51 formed on the circuit surface side of the semiconductor chip 5 to a conductive material 61 such as solder for bonding that is adhered to a connection pad of the adherend 6 and melting the conductive material (a flip-chip bonding step). At this time, a space is formed between the semiconductor chip 5 and the adherend 6, and the distance of the space is generally about 30 to 300 μm. After flip-chip bonding (flip-chip connection) of the semiconductor chip 5 onto the adherend 6, it is important to wash the facing surface and the space between the semiconductor chip 5 to the adherend 6 and to seal the space by filling the space with a sealing material such as a sealing resin.

Various substrates such as a lead frame and a circuit board (a wiring circuit board, for example) can be used as the adherend 6. The material of the substrate is not especially limited, and examples thereof include a ceramic substrate and a plastic substrate. Examples of the plastic substrate include an epoxy substrate, a bismaleimide triazine substrate, and a polyimide substrate.

The material of the bump and the conductive material in the flip-chip bonding step are not especially limited, and examples thereof include solders (alloys) of a tin-lead metal material, a tin-silver metal material, a tin-silver-copper metal material, a tin-zinc metal material, and a tin-zinc-bismuth metal material, a gold metal material, and a copper metal material.

In the flip-chip bonding step, the bump of the circuit surface side of the semiconductor chip 5 and the conductive material on the surface of the adherend 6 are connected by melting the conductive material. The temperature when the conductive material is molten is normally about 260° C. (250 to 300° C., for example). The dicing tape-integrated film for semiconductor back surface of the present invention can have heat resistance so that it can resist a high temperature in the flip-chip bonding step by forming the film for semiconductor back surface with an epoxy resin, or the like.

In this step, the facing surface (an electrode forming surface) and the space between the semiconductor chip 5 and the adherend 6 are preferably washed. The washing liquid that is used in washing is not especially limited, and examples thereof include an organic washing liquid and a water washing liquid. The film for semiconductor back surface in the dicing tape-integrated film for semiconductor back surface of the present invention has solvent resistance to the washing liquid, and does not substantially have solubility in these washing liquids. Because of that, various washing liquids can be used as the washing liquid, and washing can be performed by a conventional method without requiring a special washing liquid.

Next, a sealing step is performed to seal the space between the flip-chip bonded semiconductor chip 5 and the adherend 6. The sealing step is performed using a sealing resin. The sealing condition is not especially limited. Thermal curing of the sealing resin is performed normally by heating the sealing resin at 175° C. for 60 to 90 seconds. However, the present invention is not limited to this, and curing can be performed at 165 to 185° C. for a few minutes, for example. By the thermal treatment in this step, not only the sealing resin but also the film 2 for semiconductor back surface is thermally cured. Accordingly, both the sealing resin and the film 2 for semiconductor back surface are cured and shrunk along with the progress of the thermal curing. As a result, the stress to be given to the semiconductor chip 5 owing to the curing shrinkage of the sealing resin can be cancelled or relaxed through the curing shrinkage of the film 2 for semiconductor back surface. In this step, the film 2 for semiconductor back surface can be completely or almost completely thermally cured, and can be bonded onto the back surface of the semiconductor element with excellent tackiness. Further, the uncured film 2 for semiconductor back surface according to the invention can be thermally cured together with the sealing material in the sealing step, so that it is not necessary to newly add a step of thermal curing the film 2 for semiconductor back surface.

The sealing resin is not especially limited as long as it is a resin having insulation properties, and can be appropriately selected from sealing materials such as a known sealing resin. However, an insulating resin having elasticity is preferable. Examples of the sealing resin include a resin composition containing an epoxy resin. Examples of the epoxy resin include epoxy resins described above. The sealing resin with a resin composition containing an epoxy resin may contain a thermosetting resin such as a phenol resin other than the epoxy resin, a thermoplastic resin, and the like as a resin component besides the epoxy resin. The phenol resin can also be used as a curing agent for the epoxy resin, and examples of the phenol resin include the above-described phenol resins.

In the semiconductor device (flip chip-mounted semiconductor device) produced using the dicing tape-integrated film 1 for semiconductor back surface or the film 2 for semiconductor back surface, the film for semiconductor back surface is bonded onto the back surface of the semiconductor chip. Therefore, various types of marking can be applied with excellent visibility. In particular, even when the marking method is a laser marking method, laser marking can be applied with an excellent contrast ratio, and it is possible to observe various kinds of information (for example, literal information and graphical information) applied by laser marking with good visibility. At the laser marking, a known laser marking apparatus can be utilized. As the laser, it is possible to utilize various lasers such as a gas laser, a solid-state laser, and a liquid laser. Specifically, as the gas laser, any known gas lasers can be utilized without particular limitation, but a carbon dioxide laser ($CO_2$ laser) and an excimer laser (ArF laser, KrF laser, XeCl laser, XeF laser, or the like) are suitable. As the solid-state laser, any known solid-state lasers can be utilized without particular limitation, but a YAG laser (such as Nd:YAG laser) and a $YVO_4$ laser are suitable.

Because the semiconductor device that is manufactured using the dicing tape-integrated film for semiconductor back surface or the film for semiconductor back surface of the present invention is a semiconductor device that is mounted by a flip-chip mounting method, the semiconductor device has a shape thinner and smaller than a semiconductor device that is mounted by a die bonding mounting method. Because of this, the semiconductor device can be suitably used as various electronic apparatuses and electronic parts or materials and members thereof. Specific examples of the electronic apparatus in which the flip-chip mounted semiconductor device of the present invention can be used include a portable phone, PHS, a small computer such as PDA (personal digital assistant), a notebook personal computer, Netbook (trademark), or a wearable computer, a small electronic apparatus in which a portable phone and a computer are integrated, Digital Camera (trademark), a digital video camera, a small television, a small game machine, a small digital audio player, an electronic organizer, an electronic dictionary, an electronic apparatus terminal for an electronic book, and a mobile electronic apparatus (portable electronic apparatus) such as a small digital type clock or watch. Examples of the electronic apparatus also include an electronic apparatus other than a mobile type apparatus (i.e., a stationary apparatus) such as a desktop personal computer, a flat-panel television, an electronic apparatus for recording and playing such as a hard disc recorder or a DVD player, a projector, or a micromachine. Examples of the electronic parts or materials and members of the electronic apparatus and electronic parts include a component of CPU and components of various recording apparatuses such as a memory and a hard disk.

EXAMPLES

Hereinafter, the present invention will be described in detail with reference to examples. However, the invention is not limited to the following examples unless it exceeds the gist thereof. "Part(s)" in each example is on a weight basis unless otherwise stated.

Example 1

In methyl ethyl ketone, 53 parts of an epoxy resin (trade name "HP-4700" manufactured by DIC Corporation), 69 parts of a phenolic resin (trade name "MEH-7851H" manufactured by Meiwa Plastic Industries, Ltd.), 153 parts of spherical silica (trade name "SE-2050-MCV" manufactured by Admatechs Co., Ltd.), and 7 parts of a coloring agent (trade name "ORIPAS B-35" manufactured by Orient Chemical Industries Co., Ltd.), based on 100 parts of an acrylate-based polymer (trade name "Teisan Resin SG-P3" manufactured by Nagase ChemteX Corporation) containing ethyl acrylate and methyl methacrylate as main components, were dissolved, to prepare a solution of an adhesive composition having a solid concentration of 22% by weight.

The solution of the adhesive composition was applied onto a release-treated film, as a release liner (separator), made of a polyethylene terephthalate film having a thickness of 50 µm, which had been subjected to a silicone release treatment, and then dried at 130° C. for 2 minutes to produce a film for semiconductor back surface having a thickness of 25 µm.

Example 2

In methyl ethyl ketone, 9 parts of an epoxy resin (trade name "HP-4700" manufactured by DIC Corporation), 12 parts of a phenolic resin (trade name "MEH-7851H" manufactured by Meiwa Plastic Industries, Ltd.), 69 parts of spherical silica (trade name "SE-2050-MCV" manufactured by Admatechs Co., Ltd.), and 7 parts of a coloring agent (trade name "ORIPAS B-35" manufactured by Orient Chemical Industries Co., Ltd.), based on 100 parts of an acrylate-based polymer (trade name "Teisan Resin SG-P3" manufactured by Nagase ChemteX Corporation) containing ethyl acrylate and methyl methacrylate as main components, were dissolved, to prepare a solution of an adhesive composition having a solid concentration of 22% by weight.

The solution of the adhesive composition was applied onto a release-treated film, as a release liner (separator), made of a polyethylene terephthalate film having a thickness of 50 µm, which had been subjected to a silicone release treatment, and then dried at 130° C. for 2 minutes to produce a film for semiconductor back surface having a thickness of 25 µm.

Example 3

In methyl ethyl ketone, 153 parts of spherical silica (trade name "SE-2050-MCV" manufactured by Admatechs Co., Ltd.) and 7 parts of a coloring agent (trade name "ORIPAS B-35" manufactured by Orient Chemical Industries Co., Ltd.), based on 100 parts of an acrylate-based polymer (trade name "Teisan Resin SG-P3" manufactured by Nagase ChemteX Corporation) containing ethyl acrylate and methyl methacrylate as main components, were dissolved, to prepare a solution of an adhesive composition having a solid concentration of 22% by weight.

The solution of the adhesive composition was applied onto a release-treated film, as a release liner (separator), made of a polyethylene terephthalate film having a thickness of 50 µm, which had been subjected to a silicone release treatment, and then dried at 130° C. for 2 minutes to produce a film for semiconductor back surface having a thickness of 25 µm.

Comparative Example 1

In methyl ethyl ketone, 7 parts of a coloring agent (trade name "ORIPAS B-35" manufactured by Orient Chemical Industries Co., Ltd.), based on 100 parts of an acrylate-based polymer (trade name "Teisan Resin SG-P3" manufactured by Nagase ChemteX Corporation) containing ethyl acrylate and methyl methacrylate as main components, was dissolved, to prepare a solution of an adhesive composition having a solid concentration of 22% by weight.

The solution of the adhesive composition was applied onto a release-treated film, as a release liner (separator), made of a polyethylene terephthalate film having a thickness of 50 µm, which had been subjected to a silicone release treatment, and then dried at 130° C. for 2 minutes to produce a film for semiconductor back surface having a thickness of 25 µm.

Comparative Example 2

In methyl ethyl ketone, 109 parts of an epoxy resin (trade name "HP-4700" manufactured by DIC Corporation), 141 parts of a phenolic resin (trade name "MEH-7851H" manufactured by Meiwa Plastic Industries, Ltd.), 120 parts of spherical silica (trade name "SE-2050-MCV" manufactured by Admatechs Co., Ltd.), and 7 parts of a coloring agent (trade name "ORIPAS B-35" manufactured by Orient Chemical Industries Co., Ltd.), based on 100 parts of an acrylate-based polymer (trade name "Teisan Resin SG-P3" manufactured by Nagase ChemteX Corporation) containing ethyl acrylate and methyl methacrylate as main components, were dissolved, to prepare a solution of an adhesive composition having a solid concentration of 22% by weight.

The solution of the adhesive composition was applied onto a release-treated film, as a release liner (separator), made of a polyethylene terephthalate film having a thickness of 50 µm, which had been subjected to a silicone release treatment, and then dried at 130° C. for 2 minutes to produce a film for semiconductor back surface having a thickness of 25 µm.

(Evaluation)

The films for semiconductor back surface produced in Examples 1 to 3 and Comparative Examples 1 and 2 were evaluated as follows. The results are shown in Table 1.

<Measurement of Adhering Strength of Film for Semiconductor Back Surface to Semiconductor Wafer>

The adhering strength (N/10 mm width) of the film for semiconductor back surface to a semiconductor wafer was measured as follows: A silicon wafer as a semiconductor wafer was put on a hot plate, and at a predetermined temperature (50° C.), a film for semiconductor back surface having a length of 150 mm and a width of 10 mm, of which the back surface had been reinforced with a pressure-sensitive adhesive tape (trade name "BT-315", manufactured by Nitto Denko Co., Ltd.), was bonded to the silicon wafer by pressing the film with a 2-kg roller moved once back and forth thereon. Subsequently, this was kept on the hotplate (50° C.) for 2 minutes, and then kept at room temperature (23° C. or so) for 20 minutes. After that, using a peeling tester (trade name "Autograph AGS-J" manufactured by SHIMADZU CORPORATION), the back-reinforced film for semiconductor back surface was peeled at a temperature of 70° C., a peeling angle of 180 degrees and a tension rate of 300 mm/min (that is, the film for semiconductor back surface was peeled from the semiconductor wafer at the interface between the two), and the maximum peeling load (the maximum load except the initial peak top) was measured. The maximum load was taken as the adhering strength of the film for semiconductor back surface to the semiconductor wafer.

<Measurement of Rupture Elongation>

Using a roll laminator (device name "MRK-600" manufactured by MCK CO., LTD.), a film for semiconductor back surface produced at 70° C. and 0.2 MPa was laminated to obtain a 100 µm-thick film for semiconductor back surface for measurement. The film for semiconductor back surface for measurement was cut to a size of 10 mm (width)×30 mm (length) to obtain a test piece. A tension test was then conducted at a tension rate of 50 mm/min, a chuck-to-chuck distance of 10 mm, and a temperature of 25° C. using "AUTOGRAPH ASG-50D Model" (manufactured by Shimadzu Corporation) as a tension tester. A rupture elongation (%) was determined based on the following formula:

a rupture elongation (%)=$\{(D_1-D_0)/D_0\} \times 100\%$ where $D_0$ is a chuck-to-chuck distance before the test, and $D_1$ is a chuck-to-chuck distance when the test piece was ruptured.

<Method for Measuring Degree of Swelling>

About 0.1 g of a sample was sampled from the film for semiconductor back surface and precisely weighed (weight of sample) and, after the sample was wrapped in a mesh sheet, it was immersed in about 50 mL of ethanol at room temperature for 1 week. Thereafter, a solvent-insoluble matter (content in the mesh sheet) was taken out of ethanol and air-dried at room temperature until the weight change reached 1% or less. The solvent-insoluble matter after air drying was weighed (weight W1 after immersing and air drying). Then, the solvent-insoluble matter was dried by heating at 130° C. for about 2 hours, and the solvent-insoluble matter after drying was weighed (weight W2 after immersing and drying by heating). A degree of swelling (% by weight) was calculated according to the following expression (a).

Degree of swelling (% by weight)=$[(W1-W2)/W2] \times 100$     (a)

<Method for Evaluating Peeling Property (Reworkability)>

A semiconductor wafer (diameter: 8 inches, thickness: 0.6 mm; a silicon mirror wafer) was subjected to a back surface polishing treatment and a mirror wafer having a thickness of 0.2 mm was used as a workpiece. The mirror wafer (workpiece) was bonded onto the film for semiconductor back surface by roller press-bonding at 70° C. After heat release to room temperature, the film for semiconductor back surface was peeled from an end thereof by the pressure-sensitive adhesive tape BT-315 (manufactured by Nitto Denko Co., Ltd.). The case where the film for semiconductor back surface was peeled without rupture and without generating any residue on the wafer, or the generated residue was cleanly removed by ethanol was evaluated as "◯". The case where the film for semiconductor back surface was ruptured, and the case where the residue was generated on the wafer was evaluated as "x".

TABLE 1

|  | Example 1 | Example 2 | Example 3 | Comparative Example 1 | Comparative Example 2 |
| --- | --- | --- | --- | --- | --- |
| Rupture elongation at 25° C. [%] | 2 | 500 | 700 | 1000 | 100 |
| Adhering strength at 70° C. | 1 | 5 | 7 | 7 | 8 |
| Degree of swelling [% by weight] | 1 | 2 | 1 | 0.5 | 0.5 |
| Peeling property (reworkability) | ◯ | ◯ | ◯ | x | x |

From Table 1, the films for semiconductor back surface according to Examples 1 to 3 had a good peeling property (reworkability). On the other hand, the films for semiconductor back surface according to Comparative Examples 1 and 2 had too high a rupture elongation or too high an adhering strength, which caused a poor peeling property.

What is claimed is:

1. A film for semiconductor back surface having:
   an adhering strength at 70° C. of 7 N/10 mm or less to a wafer before the film is thermally cured; and
   a rupture elongation at 25° C. of 700% or less,
   wherein the film contains an acrylic resin and 50 to 200 parts by weight of an inorganic filler based on 100 parts by weight of the acrylic resin.

2. The film for semiconductor back surface according to claim 1, wherein the film has a degree of swelling due to ethanol of 1% by weight or more.

3. A dicing tape-integrated film for semiconductor back surface, comprising:
   a dicing tape comprising a base material and a pressure-sensitive adhesive layer that are laminated in this order; and
   the film for semiconductor back surface according to claim 1 laminated on the pressure-sensitive adhesive layer of the dicing tape.

4. A method for producing a semiconductor device using the dicing tape-integrated film for semiconductor back surface according to claim 3, the method comprising:
   bonding a semiconductor wafer onto the film for semiconductor back surface of the dicing tape-integrated film for semiconductor back surface;
   dicing the semiconductor with a cutting depth so controlled as to fall within a range overstepping one surface of the pressure-sensitive adhesive layer that faces the film for semiconductor back surface and not reaching another surface of the pressure-sensitive adhesive layer that faces the base material to form a semiconductor chip;
   peeling the semiconductor chip from the pressure-sensitive adhesive layer of the dicing tape together with the film for semiconductor back surface; and
   flip chip-connecting the semiconductor chip onto an adherend.

\* \* \* \* \*